United States Patent [19]

Wargo

[11] Patent Number: 4,636,735

[45] Date of Patent: Jan. 13, 1987

[54] DURATION-SENSITIVE DIGITAL SIGNAL STRETCHER

[75] Inventor: Robert A. Wargo, Ringoes, N.J.

[73] Assignee: RCA Corporation, Princeton, N.J.

[21] Appl. No.: 724,644

[22] Filed: Apr. 18, 1985

[51] Int. Cl.[4] .......................................... H03K 5/153
[52] U.S. Cl. ..................................... 328/58; 328/112; 307/234; 307/267; 307/602
[58] Field of Search ................. 328/58, 111, 112, 602; 307/265, 267, 234

[56] References Cited

U.S. PATENT DOCUMENTS

| | | | |
|---|---|---|---|
| 3,379,981 | 4/1968 | Humpherys | 328/112 |
| 3,614,632 | 10/1971 | Leibowitz et al. | 328/58 |
| 3,667,054 | 5/1972 | Nelson | 307/234 |
| 4,061,975 | 12/1977 | Sugai | 328/112 |
| 4,200,810 | 4/1980 | Cain et al. | 328/58 |
| 4,214,270 | 7/1980 | Morito | 307/234 |
| 4,233,525 | 11/1980 | Tatahashi et al. | 328/112 |

*Primary Examiner*—John S. Heyman
*Attorney, Agent, or Firm*—Eugene M. Whitacre; Paul J. Rasmussen; William H. Meagher

[57] ABSTRACT

Clocked control signals are applied from a source to the input of delay means having a plurality of successive signal takeoff points, with the delay between successive ones of said takeoff points being the same (e.g., a period at the signal clocking frequency, $f_{CL}$). An "and" gate is provided with a plurality of inputs equal in number to the plurality of takeoff points. Each takeoff point is linked by a signal path to a respectively different one of the "and" gate inputs. A succession of two-input "or" gates is provided, with one input of each "or" gate coupled to receive the output of the "and" gate. The last of the succession of "or" gates is coupled to a control signal output terminal. The output of each of the remainder of said succession is coupled via a respectively different one of a plurality of similar delay devices to the other input of the next succeeding one of said succession of "or" gates. Each of the delay devices imparts a delay equal to a period at $f_{CL}$. The other input of the first of said succession of "or" gates is coupled to directly receive the control signal source output.

5 Claims, 1 Drawing Figure

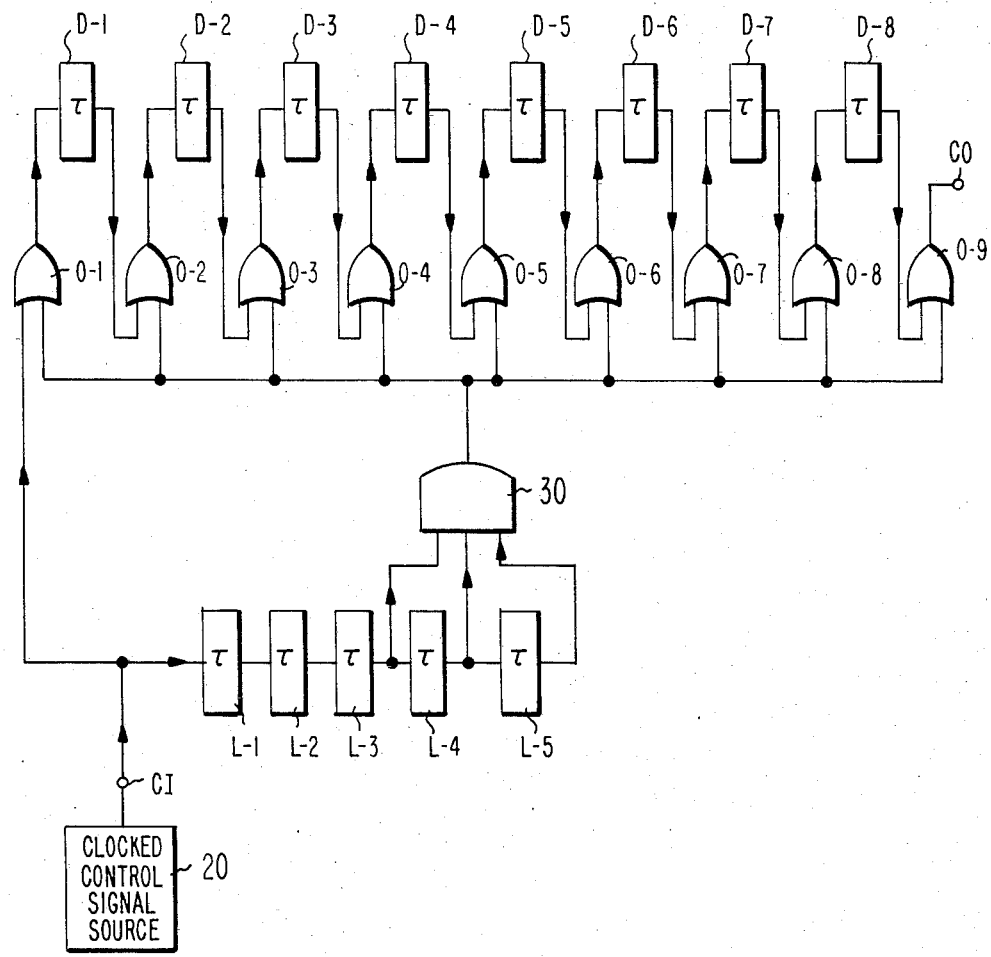

DURATION-SENSITIVE DIGITAL SIGNAL STRETCHER

The present invention relates generally to digital signal processing circuits, and particularly to a novel signal stretcher for a digital control signal, wherein the performance of the signal stretching function is rendered sensitive to the duration of predetermined input signal paramters.

In certain systems employing digital signal processing circuits, a need often arises for some form of control system, subject to actuation in an appropriate period of real time as determined by a sensing circuit, which recognizes the existence of a condition requiring control actuation via a monitoring of the digital signals being processed. Difficulties, associated, for example, with the monitoring functions, may, in some instances, suggest the wisdom of a widening of the control actuation period relative to the width of the period of condition recognition provided by the sensing circuit, thus calling for some form of control signal stretching.

The present invention is concerned with the provision of a structure which may serve such a digital control signal stretching function, dependent, however, upon the input signal meeting a minimum-duration criterion for predetermined input signal parameters.

Pursuant to the principles of the present invention, a duration-sensitive signal stretcher desirably comprises: delay means having a plurality of successive signal takeoff points; an "and" gate having a plurality of inputs equal in number to said takeoff points; a plurality of signal paths, each linking a respectively different one of said takeoff points to a respectively different one of said inputs; a plurality of delay devices; and a succession of two-input "or" gates.

In the above-described signal stretcher, the input of the delay means is coupled to a source of clocked control information signals exhibiting one or the other of two alternative signal levels, and the amount of delay between successive ones of said takeoff points is the same. Each of said plurality of delay devices imparts the same predetermined amount of delay. One input of each of said successsion of "or" gates is rendered responsive to the output of said "and" gate. The output of each of said succession of "or" gates, with the exception of the last of said succession, is coupled via a respective one of said plurality of delay devices to the other input of the next succeeding one of said succession of "or" gates, while the output of the last of said succession of "or" gates is coupled to a control signal output terminal. The sum of the delays imparted by said plurality of delay devices exceeds the amount of delay between the first and last of said successive signal takeoff points.

Pursuant to an illustrative embodiment of the present invention, wherein control signal information, of insufficient duration to meet a minimum-duration criterion for stretching, is nevertheless permitted to pass (in unstretched form) to the control signal output terminal, the other input of the first of said succession of "or" gates is rendered signal responsive by the inclusion of means (independent of said delay means and said "and" gate) for coupling the output of the signal source thereto. A different mode of operation, however, is also feasible, wherein the minimum-duration criterion for stretching also constitutes the criterion for information passage to the control signal output terminal. Reference may be made to the copending U.S. patent application Ser. No. 724,646 of L. A. Harwood, et al., entitled "Duration-Sensitive Digital Signal Gate" and concurrently filed herewith, for an example of a structure operating in the latter mode. Where such a mode of operation is intended, it is desirable that the other input of the first of the succession of "or" gates is rendered non-responsive to the input signals, as shown in said copending Harwood, et al. application.

In the sole figure of the accompanying drawing, a duration-sensitive stretcher for digital control signals, pursuant to an embodiment of the present invention, is schematically illustrated.

In the system of the drawing, the output of a clocked control signal source 20 appears at terminal CI as a one-bit stream of control information, exhibiting either a quiescent "0" level or an active "1" level during each successive clocking interval. The signal at terminal CI is applied to the input of a series of five similar delay devices (L-1,L-2,L-3,L-4,L-5) connected in cascade. Illustratively, each of these delay devices comprises a data-type flip-flop imparting a signal-delay ($\tau$) corresponding to a period at the signal clocking frequency ($f_{CL}$).

The cascade connection of the delay devices (L-1,L-2 ... L-5) forms a delay means which exhibits a delay of a $\tau$ amount between succeeding ones of a trio of signal takeoff points (located successively at the respective outputs of delay devices L-3,L-4 and L-5). An "and" gate 30 is provided with three inputs, each linked by a signal path to a respectively different one of the aforementioned signal takeoff points.

The output of "and" gate 30 is coupled to one input of each of a succession of nine two-input "or" gates (O-1,O-2,O-3 ... O-9). The output of the last "or" gate (O-9) of the succession is coupled to a control signal output terminal CO. The output of each of the remainder of this succession of "or" gates is coupled to the other input of the next succeeding "or" gate in the succession via a respectively different one of a plurality of similar delay devices (D-1,D-2,D-3 ... D-8). Illustratively, each of these delay devices also comprises a data-type flip-flop imparting a signal delay ($\tau$) corresponding to a period at the signal clocking frequency ($f_{CL}$).

The illustrated structure is completed by a signal path providing a direct coupling of the signals at terminal CI to the other input of the first (O-1) of said succession of "or" gates.

It will be appreciated that, in the system of the drawing, the structure interposed between control signal source terminal CI and control signal output terminal CO serves a duration-sensitive signal stretching function, subjecting control information which satisfies a duration criterion to a stretching action, while passing in unstretched form control information which fails to satisfy such a criterion. In the specific arrangement shown, the duration criterion is such as to require exhibition of a "1" level at terminal CI for at least three successive clocking intervals in order for output control period stretching to occur.

To aid in an understanding of the operation of the illustrated signal stretching structure, several input signal examples will be considered below.

EXAMPLE 1

Terminal CI departs from a quiescent "0" level for only two successive clocking intervals; i.e., the input signal duration of two successive clocking intervals is below the duration criterion (three successive clocking intervals) required for stretching action to occur. The pair of successive "1" outputs of source 20 are clocked along a first signal path comprising delay devices D-1,D-2, etc. in cascade, ultimately appearing at control signal output terminal CO as an output control pulse of an unstretched, (two-clocking-interval) duration. Throughout the period of control information passage to output terminal CO, "and" gate 30 remains inactive, failing to output a "1" because of the lack of simultaneous appearances of "1" levels at all three of its inputs. While a "1" level appears at one or two of the "and" gate inputs during certain clocking intervals, as the signals from terminal CI traverse a second signal path formed by devices L-1,L-2, etc. in cascade, the insufficient duration (two successive clocking intervals) of the input signal elevation of terminal CI to a "1" level assures that "and" gate 30 will not be activated to output a "1" level.

EXAMPLE 2

Terminal CI departs from a quiescent "0" level for three successive clocking intervals, i.e., the input signal duration equals the duration criterion (three successive clocking intervals) required for stretching action to occur. In this instance, as the signals from terminal CI traverse the aforementioned second signal path, a clocking interval is reached when all three inputs of "and" gate 30 are simultaneously elevated to a "1" level, wherefore "and" gate 30 outputs a "1". Because of this "and" gate activity during such a clocking interval, a "1" level simultaneously appears at the control signal output terminal CO and at the inputs of all eight of the delay devices D-1,D-2 ... D-8. Accordingly, a "1" will be outputted at terminal CO for the aforesaid clocking interval and for eight successive clocking intervals subsequent thereto. Thus, an input signal with a control period duration of three clocking intervals is converted to an output signal with a control period duration of nine clocking intervals.

EXAMPLE 3

Terminal CI departs from a quiescent "0" level for five successive clocking intervals; i.e. the input signal duration exceeds the duration criterion (three successive clocking intervals) required for stretching action to occur. In this instance, a "1" level simultaneously appears at the control signal output terminal CO and at the inputs of all eight of the delay devices D-1,D-2 ... D-8 in three successive clocking intervals. As in Example 2 above, a stretching of a duration of six clocking intervals is a consequence, wherefore an output signal with a control period duration of eleven clocking intervals is the result.

The duration-sensitive stretching techniques of the present invention may, if desired, be associated with a duration-sensitive signal gate, as described in the aforementioned copending patent application of Harwood, et al. In the structure therein disclosed, input signals meeting the duration criterion appear in stretched form at the control signal output terminal; however, input signals which fail to satisfy the duration criterion are blocked from passage to the control signal output terminal (rather than passed thereto in unstretched form, as achieved in the herein described embodiment).

In the invention embodiment illustrated herein, testing of the input signal for the duration criterion is based on the monitoring of immediatedly successive samples of the input signal (at the "and" gate inputs). The aforementioned copending Harwood, et al. patent application illustrates an alternative technique wherein testing for the duration criterion is based on the monitoring of alternate samples of the input signal (via use of delays of $2\tau$ between the successive signal takeoff points providing inputs for the "and" gate).

It will be appreciated that the number of signal takeoff points, and the delays therebetween, are selectable parameters for tailoring the duration criterion to particular system requirements. It will also be recognized that the degree to which the sum of the delays provided by delay devices D-1,D-2, etc. exceeds the delay between the first and the last of the aforementioned signal takeoff points is a selectable parameter determinative of the magnitude of stretching action to be attained.

What is claimed is:

1. A duration-sensitive signal stretcher, for use with a clocked source of control information signals exhibiting one or the other of two alternative signal levels comprising:

delay means having a plurality of successive signal takeoff points; the amount of delay between successive ones of said takeoff points being the same; the input of said delay means being responsive to the output of said signal source;

a plurality of signal paths, each connected to a respectively different one of said signal takeoff points;

an "and" gate having a plurality of inputs equal in number to said plurality of signal paths, each of said signal paths terminating at a respectively different one of said plurality of inputs of said "and" gate;

a plurality of delay devices, each imparting the same predetermined amount of delay;

a succession of two-input "or" gates, with one input of each rendered responsive to the output of said "and" gate; with the output of each of said succession of "or" gates, with the exception of the last of said succession, being coupled via a respective one of said plurality of delay devices to the other input of the next succeeding one of said succession of "or" gates; and with the output of said last of said succession of "or" gates coupled to a control signal output terminal; and means for supplying to the other of said inputs of the first of said succession of two-input "or" gates a signal appearing at the output of said "and" gate;

wherein the sum of the delays imparted by said plurality of delay devices exceeds the amount of delay between the first and last of said sucessive signal takeoff points.

2. Apparatus in accordance with claim 1, said supplying means, independent of said delay means and said "and" gate, for coupling the output of said signal source to the other input of the first of said succession of two-input "or" gates.

3. Apparatus in accordance with claim 2, wherein said predetermined amount of delay imparted by each of said plurality of delay devices corresponds to a period at the clocking frequency for said signals.

4. Apparatus in accordance with claim 3 wherein delivery of signals from said source to the first of said plurality of successive signal takeoff points is delayed relative to delivery of signals from said source to said other input of the first of said succession of two-input "or" gates.

5. Apparatus in accordance with claim 3, wherein the amount of delay between successive ones of said signal takeoff points corresponds to a period at the clocking frequency for said signals.

* * * * *